United States Patent [19]
Quist

[11] Patent Number: 5,892,380
[45] Date of Patent: Apr. 6, 1999

[54] METHOD FOR SHAPING A PULSE WIDTH AND CIRCUIT THEREFOR

[75] Inventor: Brent W. Quist, Mesa, Ariz.

[73] Assignee: Motorola, Inc., Schaumberg, Ill.

[21] Appl. No.: 905,624

[22] Filed: Aug. 4, 1997

[51] Int. Cl.[6] .................................................. H03K 3/017
[52] U.S. Cl. ......................... 327/172; 327/156; 327/159; 327/12; 327/176
[58] Field of Search .................................. 327/2, 3, 7, 12, 327/156, 159, 172, 176

[56] References Cited

U.S. PATENT DOCUMENTS 5,539,345  7/1996  Hawkins ................................. 327/150

*Primary Examiner*—Kenneth B. Wells
*Assistant Examiner*—Minh Nguyen
*Attorney, Agent, or Firm*—Rennie William Dover; Robert D. Atkins; Lanny L. Parker

[57] ABSTRACT

A phase-frequency detector (12) is configured for operating at a high frequency. A transition of a clock signal (REF CLK) is detected by a first latch (52) and a signal UP is generated. A transition of a feedback signal (FBK) is detected by a second latch (56) and a signal DOWN is generated. An logic circuit (64) detects the signals UP and the DOWN and generates a reset signal (RESET). A pulse-width of the reset signal (RESET) is controlled and limited by the logic circuit (64) to provide a faster response time for setting the first and second latches (52 and 56) to a state that allows detection of the phase and frequency differences between the clock signal (REF CLK) and the feedback signal (FBK).

13 Claims, 2 Drawing Sheets

5,892,380

1

METHOD FOR SHAPING A PULSE WIDTH AND CIRCUIT THEREFOR

BACKGROUND OF THE INVENTION

The present invention relates, in general, to integrated circuits and, more particularly, to phase-frequency detector circuits.

Phase-locked loops (PLLS) are widely used for clock generation in data communication systems, local area networks, data storage applications, disc drives, and microprocessors. The five parts of a phase-locked loop typically include a phase-frequency detector (PFD), a charge-pump, a low-pass loop filter, a voltage-controlled oscillator (VCO), and a programmable divider. The PLL minimizes the skews of the phase and the frequency between an externally supplied reference clock and a feedback signal that is generated by the VCO and transferred to the programmable divider.

The PFD monitors the relative timing between the edges of the reference clock and the feedback signal and generates two output pulses of varying width that indicate whether the reference clock leads or lags the feedback signal. The output pulses are used for adjusting an analog signal that controls the VCO operating frequency, thus minimizing the skews of the phase and the frequency between the reference clock and the feedback signal from the programmable divider.

The phase offset and maximum frequency of the PLL system can be limited by the linearity and frequency response of the PFD. Typically, the PFD uses latches to detect the phase-frequency relationship between the reference clock and the feedback signal. The latches switch states at the transition edges of the reference clock and the feedback signal. A comparison of the outputs of the latches determines both the width of the pulses that are generated at the output of the PFD and the phase relationship between the reference clock and the feedback signals, i.e., whether the feedback signal leads or lags the reference clock. After the comparison of the latched output signals, the latches are switched to a state that allows detection of the next transition of the reference clock and the feedback signal edges. The maximum frequency of the PFD is limited by the speed of the circuitry that switches the latches to the state that allows detection of the next edges of the reference clock and the feedback signal.

Accordingly, it would be advantageous to have a circuit that increases the operating frequency of the phase-frequency detector.

DETAILED DESCRIPTION OF THE DRAWINGS

Figure 1:
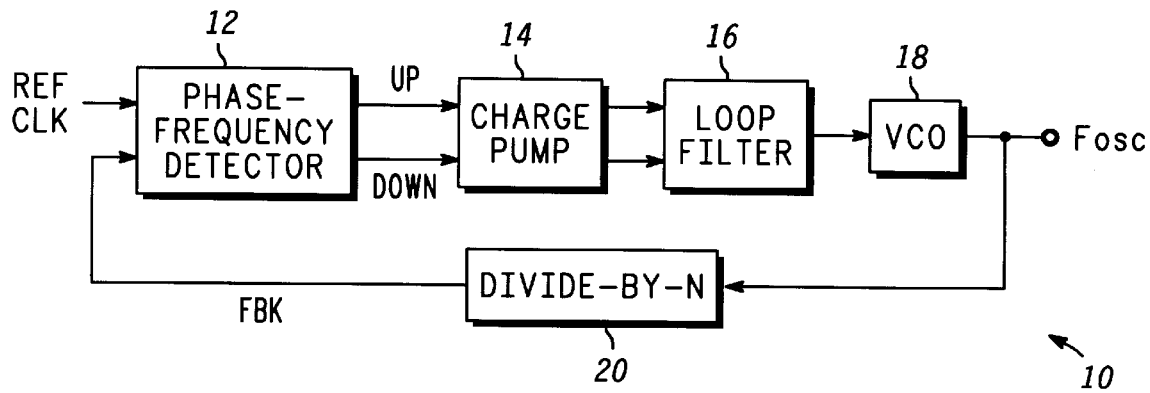
FIG. 1 is a block diagram of a phase-locked loop system in accordance with the present invention.

FIG. 1 is a block diagram of a phase-locked loop (PLL) system 10 in accordance with the present invention. PLL system 10 includes a Phase-Frequency Detector (PFD) 12

2 having an input terminal that receives a clock signal REF CLK and an input terminal that receives a feedback signal FBK. PFD 12 is also referred to as a semiconductor detector circuit. PFD 12 has two output terminals that are connected to corresponding input terminals of a charge pump 14. Charge pump 14 is also referred to as an integrator. Similarly, charge pump 14 has two output terminals that are connected to corresponding input terminals of a loop filter 16. The output terminal of loop filter 16 is connected to an input terminal of a Voltage-Controlled Oscillator (VCO) 18. The output terminal of VCO 18 is connected to the input terminal of a divide-by-N counter 20. The output terminal of divide-by-N counter 20 is connected to the input terminal of PFD 12 and supplies feedback signal FBK.

In operation, PFD 12 generates output signals UP and DOWN in response to clock signal REF CLK and feedback signal FBK. By way of example, the signal UP transitions to a high state, i.e., a logic one level, and maintains that logic state during the time that clock signal REF CLK is leading feedback signal FBK. It should be noted that a first signal is said to be leading a second signal when the first signal transitions from a low logic level to a high logic level before the second signal transitions from a low logic level to a high logic level. Likewise, the first signal is said to be lagging the second signal when the first signal transitions from a logic low level to a logic high level after the second signal transitions from a logic low level to a logic high level. Accordingly, clock signal REF CLK leads feedback signal FBK when clock signal REF CLK transitions from a logic low level to a logic high level before feedback signal FBK transitions from a logic low level to a logic high level. Similarly, clock signal REF CLK lags feedback signal FBK when clock signal REF CLK transitions from a logic low level to a logic high level after feedback signal FBK transitions from a logic low level to a logic high level. PFD 12 generates the signal DOWN having a high state and maintains that logic state during the time that clock signal REF CLK is lagging feedback signal FBK.

Charge pump 14 charges a loop filter output node. By way of example, the signal UP increases the charge on the loop filter output node and the signal DOWN decreases the charge on the loop filter output node. The charge on the loop filter output node is adjusted to produce changes in phase and frequency of the signal $F_{osc}$ such that feedback signal FBK at the output of divide-by-N counter 20 has a phase and a frequency that match the phase and frequency of clock signal REF CLK. When signals FBK and REF CLK have substantially the same phase and frequency, the loop filter output node is stabilized at a constant voltage.

Figure 2:
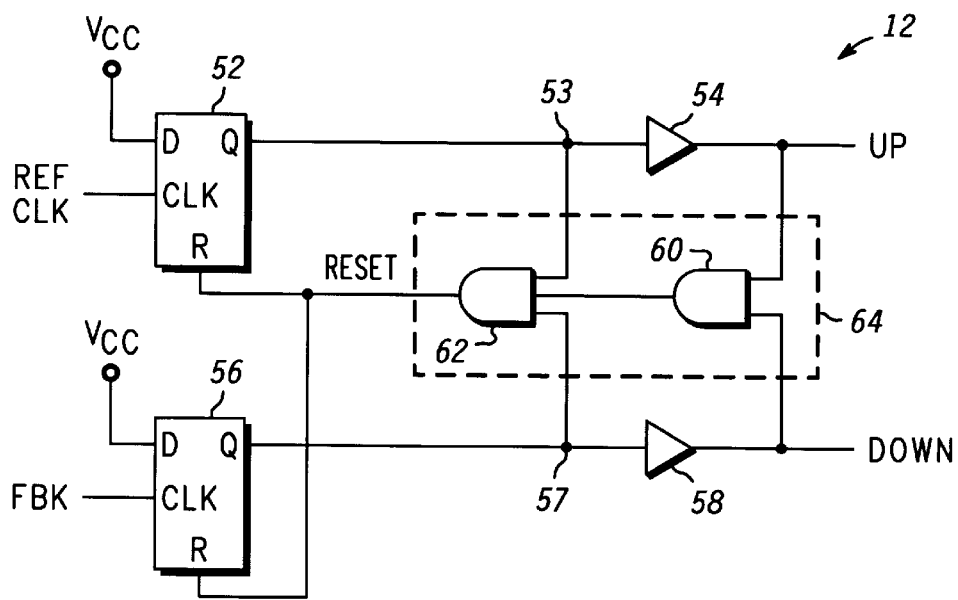
FIG. 2 is a schematic diagram of a phase-frequency detector in accordance with the present invention.

FIG. 2 is a schematic diagram of phase-frequency detector 12 (FIG. 1) in accordance with the present invention. PFD 12 includes a pair of latches 52 and 56, wherein each latch 52 and 56 has a clock input CLK, a data input D, a reset input R, and an output Q. The data inputs of latches 52 and 56 are connected to a power supply for receiving a voltage such as, for example, $V_{cc}$. Clock input CLK of latch 52 is coupled for receiving the clock signal REF CLK. Output Q of latch 52 is connected to an input node 53 of a non-inverting buffer 54. Clock input CLK of latch 56 is coupled for receiving feedback signal FBK. Output Q of latch 56 is connected to an input node 57 of a non-inverting buffer 58.

A logic circuit 64 has a first input connected to node 53, a second input connected to the output of buffer 54, a third input connected to the output of buffer 58, and a fourth input connected to node 57. An output of logic circuit 64 is commonly connected to reset input R of latches 52 and 56. Although latches 52 and 56 are shown as D-latches, it should be understood this is not a limitation of the present invention. In other words, latches 52 and 56 may be set/reset latches, flip-flops, or the like.

In accordance with a first embodiment, logic circuit 64 includes a two input AND-gate 60 and a three input AND-gate 62. The output of buffer 54 is connected to a first input of two-input AND-gate 60 and the output of buffer 58 is connected to the second input of AND-gate 60. Two-input AND-gate 60 has a first input connected to the output of buffer 54 and a second input connected to the output of buffer 58. Three-input AND-gate 62 has a first input connected to node 53, a second input connected to the output of AND-gate 60, and a third input connected to node 57. An output of AND-gate 62 is commonly connected to reset input R of latches 52 and 56.

Figure 3:
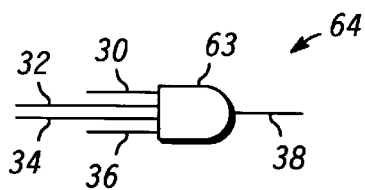
FIG. 3 is an embodiment of a portion of the phase-frequency detector of FIG. 2.

FIG. 3 is a schematic diagram of logic circuit 64 in accordance with a second embodiment. In particular, logic circuit 64 includes a four input AND-gate 63 having inputs 30, 32, 34, 36, and an output 38. Referring to FIGS. 2 and 3, input 30 connects to node 53, input 32 connects to the output of buffer 54, input 34 connects to the output of buffer 58, input 36 connects to node 57, and output 38 connects to reset input R of latches 52 and 56.

Figure 4:
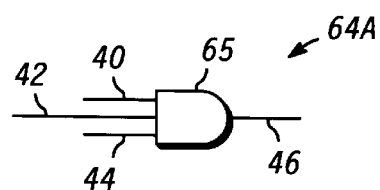
FIG. 4 is another embodiment of a portion of the phase-frequency detector of FIG. 2.

FIG. 4 is a schematic diagram of logic circuit 64A in accordance with a third embodiment. In particular, logic circuit 64A includes a three input AND-gate 65 having inputs 40, 42, and 44, and an output 46. The reference letter A is appended to the reference number 64A to indicate that both logic circuit 64 and logic circuit 64A provide an output that is the AND function of the signals at the inputs. Referring to FIGS. 2 and 4, input 40 connects to node 53, input 42 connects to the output of buffer 54, input 44 connects to the output of buffer 58, and output 46 connects to reset input R of latches 52 and 56. Alternatively, input 40 of AND-gate 65 may be connected to node 57 instead of node 53.

Figure 5:
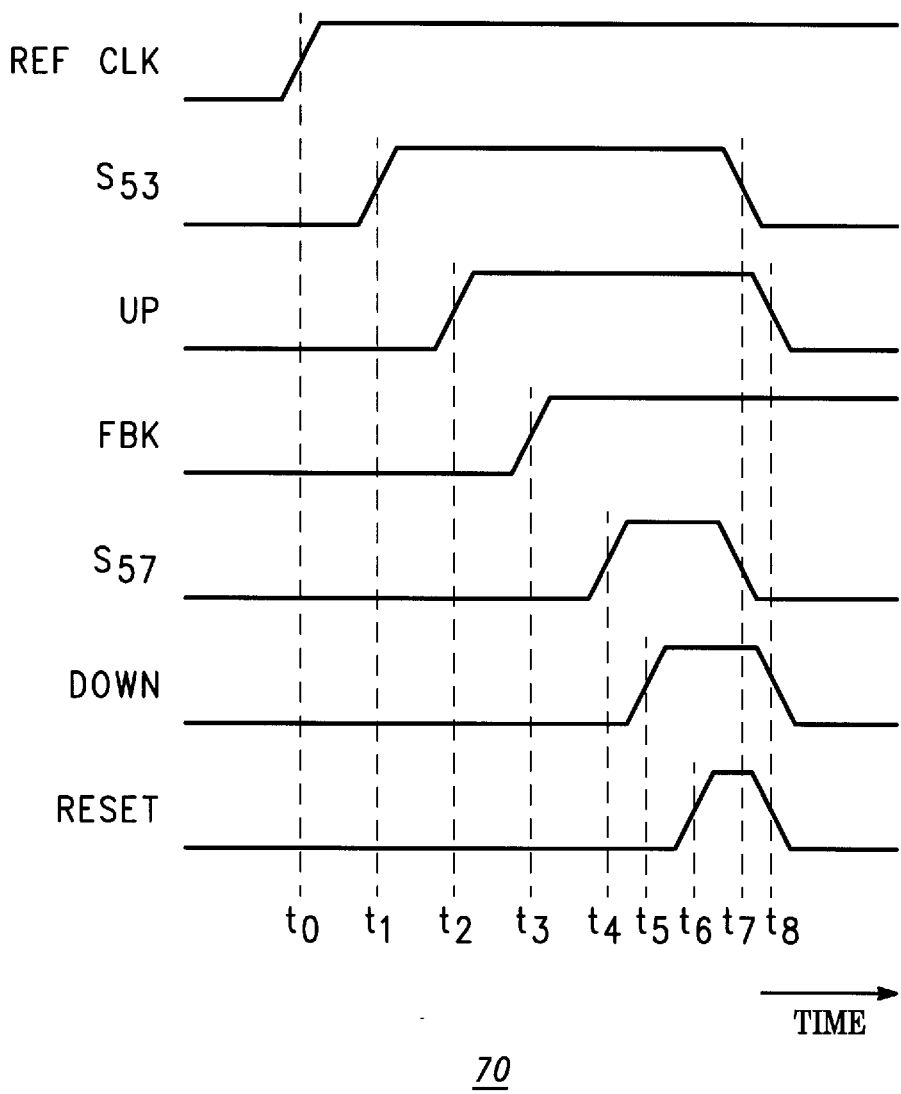
FIG. 5 illustrates timing waveforms for the phase-frequency detector of FIG. 2.

FIG. 5 illustrates timing waveforms 70 for phase-frequency detector 12 of FIG. 2. Timing waveforms 70 illustrate signals transitioning between logic levels of zero and one along the vertical axes versus time along the horizontal axes. A signal at node 53 is represented by signal $S_{53}$ and a signal at node 57 is represented by signal $S_{57}$. Timing waveforms 70 applies to the first embodiment of PFD 12 that includes AND-gates 60 and 62, to the second embodiment of PFD 12 that includes AND-gate 63, and to the third embodiment of PFD 12 that includes AND-gate 65.

In operation, a low-to-high transition of clock signal REF CLK at time $t_0$ causes the signal $S_{53}$ at the output of latch 52 to transition from a logic zero level to a logic one level at time $t_1$. Signal $S_{53}$ is transferred to the output of buffer 54 and causes signal UP to transition from a logic zero level to a logic one level at time $t_2$. At time $t_3$, feedback signal FBK transitions from a logic low voltage level to a logic high voltage level. In response to the transition of feedback signal FBK, signal $S_{57}$ transitions from a logic zero level to a logic one level at time $t_4$. Signal $S_{57}$ is transferred to the output of buffer 58 and causes signal DOWN to transition from a logic zero level to a logic one level at time $t_5$. In response to both inputs of AND-gate 60 and signals $S_{53}$ and $S_{57}$ being at a logic one level, the output signal of AND-gate 62 transitions from a logic zero level to a logic one level at time $t_6$. Signal RESET being at a logic one level causes signals $S_{53}$ and $S_{57}$ to transition from a logic one level to a logic zero level at time $t_7$. At time $t_8$ output signals UP and DOWN both transition to a logic zero level.

The logic level of reset signal RESET is controlled by the signals at the inputs of AND-gates 60 and 62. For reset signal RESET to transition from a logic zero level to a logic one level, signals $S_{53}$, UP, $S_{57}$, and DOWN must be at logic one levels. On the other hand, reset signal RESET transitions from a logic one level to a logic zero level when either of signals $S_{53}$ or $S_{57}$ are at a logic zero level. After signals $S_{53}$ or $S_{57}$ transition to a logic zero level, signals UP or DOWN transition to a logic zero level. In other words, at time $t_7$ signals $S_{53}$ and $S_{57}$ are at a logic zero level, causing reset signal RESET to transition from a logic one level to a logic zero level. AND-gate 62 has a gate delay time that is equal to the difference between times $t_8$ and $t_7$. It should be noted that because AND-gate 62 receives signals $S_{53}$ and $S_{57}$, the reset signal RESET transitions from a logic one level to a logic zero level without the additional delay of waiting for signals UP or DOWN to transition from a logic one level to a logic zero level at time $t_8$. In other words, the pulse-width of reset signal RESET is shortened.

As shown in FIG. 5, clock signal REF CLK transitions from a logic zero level to a logic one level prior to the transition of feedback signal FBK, accordingly clock signal REF CLK is said to lead feedback signal FBK. However, when clock signal REF CLK lags feedback signal FBK, the names for signals REF CLK and FBK would be transposed, the names for signals $S_{53}$ and $S_{57}$ would be transposed, and the names for signals UP and DOWN would be transposed. Reset signal RESET would still transition at time $t_6$ and time $t_8$. Timing waveforms 70 remain applicable for the first, second, and third embodiments of PFD 12 whether the clock signal REF CLK leads or lags the feedback signal FBK. It should be noted that for either condition, i.e., clock signal REF CLK leading feedback signal FBK or clock signal REF CLK lagging feedback signal FBK, the pulse-width of reset signal RESET is shortened in accordance with the input signals received by AND-gate 62 from either of the Q outputs of latches 52 and 56. The pulse-width of reset signal RESET includes a time for a reset propagation delay for resetting either latch 52 or latch 56 and an additional time for a gate delay of AND-gate 62. It should be further noted that in accordance with the present invention, the output signals of latches 52 and 56 are sampled before being used to generate signals UP and DOWN to cause reset signal RESET to transition from a high logic level to a low logic level. A shortened pulse-width for signal RESET allows PFD 12 to respond to a higher frequency clock and feedback signal, REF CLK and FBK, respectively. In the prior art, additional time delays are incurred by buffers that generate the signals UP and DOWN that increase the pulse-width of reset signal RESET.

Generally, the present invention uses a structure for the phase-frequency detector (PFD) that allows the PFD to operate over a greater frequency bandwidth. The pulse-width of a reset signal has been shortened to provide a faster response time for resetting the latches to a state that allows detection of the phase and frequency differences between a reference clock and a feedback signal.

By now it should be appreciated that a structure has been provided for the phase-frequency detector that allows operation at a higher frequency. The pulse-width of reset signal RESET has been shortened to decrease the time needed for setting the latches to a state that allows detection of the phase and frequency differences between clock signal REF CLK and feedback signal FBK of the phase-frequency detector.

I claim:

1. A semiconductor detector circuit, comprising:
   a first latch having a first input, a second input, and an output;

a second latch having a first input, a second input, and an output;

a first buffer having an input coupled to the output of the first latch and an output;

a second buffer having an input coupled to the output of the second latch and an output; and a logic circuit having a first input coupled to the output of the first buffer, a second input coupled to the output of the first latch, a third input coupled to the output of the second buffer, and an output coupled to the second input of the first latch and to the second input of the second latch that provides a reset signal at the output of the logic circuit when signals at the first, second, and third inputs of the logic circuit transition to a first logic state.

2. The semiconductor detector circuit of claim 1, wherein the logic circuit further includes a fourth input coupled to the output of the second latch.

3. The semiconductor detector circuit of claim 2, wherein the logic circuit provides an output signal that is a logical AND of signals at the first, second, third and fourth inputs of the logic circuit.

4. The semiconductor detector circuit of claim 1, wherein the first latch and the second latch are D-latches.

5. The semiconductor detector circuit of claim 1, wherein the first buffer is non-inverting.

6. The semiconductor detector circuit of claim 1, wherein the second buffer is non-inverting.

7. A phase-frequency detection circuit, comprising:

first and second memory devices;

a first buffer having an input coupled to an outout of the first memory device and an output;

a second buffer having an input coupled to an output of the second memory device and an output; and a logic circuit having a first input coupled to the output of the first memory device, a second input coupled to the output of the first buffer, a third input coupled to the output of the second buffer, and an output that provides a reset signal to the first and second memory devices, the reset signal being a logical AND of signals transitioning to a first logic state at the first, second, and third inputs of the logic circuit.

8. The phase-frequency detection circuit of claim 7, wherein the logic circuit further comprises:

a first AND-gate having a first input coupled to the output of the first buffer, a second input coupled to the output of the second buffer, and an output; and a second AND-gate having a first input coupled to the input of the first buffer, a second input coupled to the output of the first AND-gate, and an output.

9. The phase-frequency detection circuit of claim 8, wherein the second AND-gate further includes a third input coupled to the input of the second buffer.

10. A method for shaping a pulse-width, comprising the steps of:

detecting a transition of a first input signal by setting a first latch;

causing a first signal and a first buffered signal to transition to a first logic state after setting the first latch;

detecting a transition of a second input signal by setting a second latch;

causing a second buffered signal to transition to the first logic state after setting the second latch;

generating a pulse by detecting that the first buffered signal, the second buffered signal, and the first signal are in the first logic state;

resetting the first and second latches with the pulse; and terminating the pulse upon detecting that the first signal has transitioned to a second logic state based on resetting the first latch.

11. The method of claim 10, further including the step of terminating the pulse upon detecting that an output of the second latch has transitioned to the second logic state based on resetting the second latch.

12. The method of claim 10, wherein the step of setting the first latch includes setting a D-latch.

13. The method of claim 10, wherein the step of setting the second latch includes setting a D-latch.

\* \* \* \* \*